United States Patent [19]

Little et al.

[11] Patent Number: 4,506,167
[45] Date of Patent: Mar. 19, 1985

[54] HIGH SPEED LOGIC FLIP-FLOP LATCHING ARRANGEMENTS INCLUDING INPUT AND FEEDBACK PAIRS OF TRANSMISSION GATES

[75] Inventors: Wendell L. Little, Austin, Tex.; Barry W. Herold, Lauderhill, Fla.

[73] Assignee: Motorola, Inc., Schaumburg, Ill.

[21] Appl. No.: 469,541

[22] Filed: May 26, 1982

[51] Int. Cl.³ ............... H03K 3/356; H03K 23/30; H03K 19/017
[52] U.S. Cl. ............... 307/279; 307/272 A; 377/117
[58] Field of Search ........... 307/247 R, 272 A, 272 R, 307/279, 471, 440, 445, 481; 377/115–117, 119, 121

[56] References Cited

U.S. PATENT DOCUMENTS

| | | | |
|---|---|---|---|
| 3,577,166 | 5/1971 | Yung | 307/279 |
| 3,812,384 | 5/1974 | Skorup | 307/272 A X |
| 3,930,169 | 12/1975 | Kuhn, Jr. | 377/105 X |
| 4,096,401 | 6/1978 | Hollingsworth | 307/279 X |
| 4,107,556 | 8/1978 | Stewart et al. | 307/279 X |
| 4,138,613 | 2/1979 | Tanaka | 307/247 A |
| 4,181,862 | 1/1980 | Dingwall | 307/279 X |
| 4,182,961 | 1/1980 | Dingwall | 377/117 |
| 4,300,060 | 11/1981 | Yu | 307/272 A |

FOREIGN PATENT DOCUMENTS

2345670 7/1974 Fed. Rep. of Germany ...... 377/121

Primary Examiner—Larry N. Anagnos
Attorney, Agent, or Firm—Jerry A. Miller; James W. Gillman; Edward M. Roney

[57] ABSTRACT

A high speed logic latching circuit consists of a pair of inverters and feedback switches used to latch the inverters. A pair of input switching means allows data to enter the latch when the latch is disabled. This configuration allows for high speed, reduced substrate area and true complementary outputs.

25 Claims, 10 Drawing Figures

PRIOR ART

PRIOR ART

Fig. 3

| CONTROL | SWITCH |
|---|---|
| 1 (HIGH) | CLOSED |
| 0 (LOW) | OPEN |

Fig. 4

| CONTROL | SWITCH |
|---|---|
| 1 (HIGH) | OPEN |
| 0 (LOW) | CLOSED |

HIGH SPEED LOGIC FLIP-FLOP LATCHING ARRANGEMENTS INCLUDING INPUT AND FEEDBACK PAIRS OF TRANSMISSION GATES

BACKGROUND OF THE INVENTION

1. Field of the Invention

This invention relates to the field of retentative logic devices, such as latches and flip-flops. More particularly it relates to the field of high speed latches and flip-flops which have true or simultaneously occurring complementary outputs and which utilize minimum substrate area.

2. Description of the Prior Art

Several prior art circuits utilize simple inverters and transmission gates in the design of latches and flip-flops. One such device is the master/slave Toggle flip-flop shown in FIG. 1. This device is composed of identical master and slave latches which are connected together in a manner to produce the toggle action. The master latch comprises a transmission gate 22 coupled serially to inverters 24 and 26. The slave latch comprises a transmission gate 32 coupled serially to inverters 34 and 36. The output of inverter 26 is connected through a transmission gate 40 to the input of inverter 24. The output of inverter 36 is connected through a transmission gate 42 to the input of inverter 34. Clock and clock lines 52 and 54 are each coupled to the several transmission gates. Output lines Q and $\overline{Q}$ are designated 56 and 58 respectively.

Figure 1:
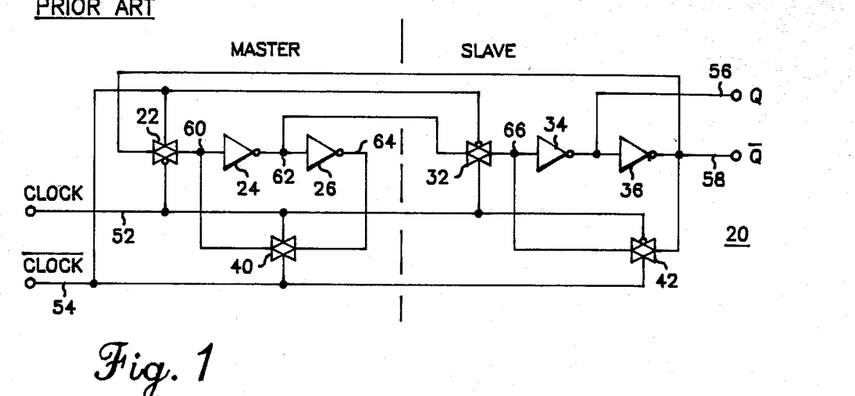
FIG. 1 shows a prior art flip-flop which utilizes inverters and transmission gates.

In this general type of configuration, the $\overline{Q}$ output signal is obtained by additionally passing the Q output signal through an inverter gate. This introduces one gate delay of time between the establishment of the Q and $\overline{Q}$ output signals. A major disadvantage of circuits such as that of FIG. 1 is that the inverting output signal $\overline{Q}$ and the non-inverting output signal Q do not change states simultaneously. Complementary logic signals which change states at substantially the same time are referred to as true complementary signals. The outputs can be forced to become truly complementary by introducing an additional propagation delay at the Q output. This, however, requires more substrate area and reduces the speed of the latch.

Figure 2:
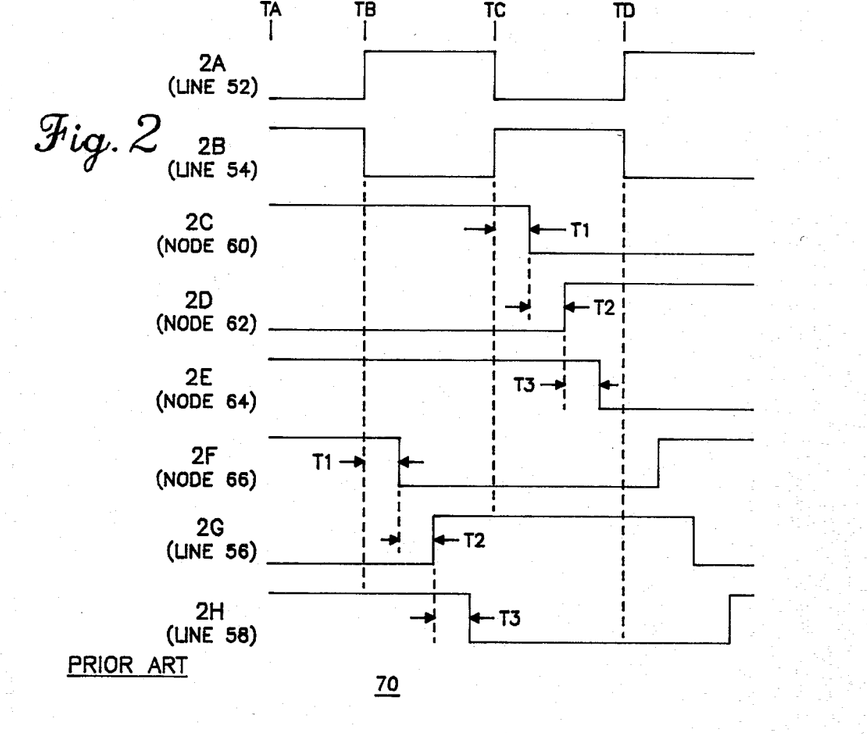
FIG. 2 is a timing diagram for the prior art flip-flop of FIG. 1.

FIG. 2, shows a timing diagram for the prior art Toggle flip-flop of FIG. 1. The period between times TA and TB is an initialization stage. During this time period the clock signal at line 52 is at a logical low and at line 54 is at a logical high; a logical low level is present at node 62 and line 56; and logical high levels are present at nodes 60, 64, 66 and line 58.

FIG. 2A shows the clock input signal present at line 52. FIG. 2B shows the clock input signal present at node 54. FIG. 2C shows the signal present at node 60. FIG. 2D shows the signal present at node 62. FIG. 2E shows the signal present at node 64. FIG. 2F shows the signal present at node 66. FIG. 2G shows the Q output signal present at line 56. FIG. 2H shows the $\overline{Q}$ output signal present at line 58.

At time TB the clock signals at lines 52 and 54 make the transition to logic high and logic low respectively. This disables transmission gates 22 and 42 while enabling transmission gates 40 and 32. This action latches the previous state into the master latch and allows the master to drive the slave into a new state.

The delay T1 in the signal at node 66 represents the time required for inverter 24 to discharge the stray capacitance associated with node 66 through transmission gate 32. The delay T2 on line 56 represents the gate delay associated with inverter 34. The delay T3 on the signal at line 58 represents the gate delay of inverter 36. The total delay required to establish a new state in the slave equals $T1+T2+T3$. It should be noted that the $\overline{Q}$ output signal at line 58 switched one full gate delay after the Q output signal at line 56.

At time TC another clock transition takes place. This transition disables transmission gates 40 and 32 while enabling transmission gates 22 and 42. This in turn latches the new state of the slave and allows the slave to drive a new state into the master. The T1 delay on the signal at node 60 represents the time required for inverter 36 to discharge the stray capacitance associated with node 60 through transmission gate 22. The delay T2 on the signal at node 62 shown in FIG. 2D represents the gate delay of inverter 24 and the delay T3 on the signal at node 64 represents the gate delay of inverter 26. The delay required to set a new state into the master equals $T1+T2+T3$ for a total of 3 propagation delays.

The fastest toggle rate of the conventional Toggle flip-flop is the time required to set a new state in the master plus the time required to set a new state in the slave. That is, the fastest toggle frequency is $1/(2\ T1+T2+T3)$.

The previous and subsequent analysis of both the high speed flip-flop of the present invention and the conventional flip-flop is made using equal sized P-channel gate areas and equal size N-channel gate areas. In addition to this, the gate area ratio of the P-and N-channel devices assume equal drive for sink and source capabilities. Both flip-flops are also unloaded. Additional capacitance on the output nodes of each flip-flop will reduce the speed of each flip-flop by an equal amount.

A severe limitation of the design of the device of FIG. 1 is that three (3) propagation delays are encountered between a master (or slave) output and a master (or slave) input. This results in relatively slow operation of the flip-flop. In order to make the device of FIG. 1 operate at high speeds necessitated by high frequencies, very large area devices are required when the flip-flop is implemented in CMOS (Complementary Metal Oxide Semiconductor). By contrast, the present invention contains more active devices than many prior art flip-flops, but a significant reduction in propagation delays enables the invention to operate at much higher frequencies and utilize much smaller transistors such that the overall substrate area required for high frequency operation is smaller than that of the prior art.

SUMMARY OF THE INVENTION

It is an object of the present invention to provide an improved logic latching device.

It is another object of the present invention to provide a high speed latching device and flip-flop.

It is a further object of the present invention to provide a logic latching device and flip-flop which has true complementary outputs.

It is a further object of the present invention to provide a logic latching device and flip-flop which has a high speed/size ratio and true complementary outputs.

These and other objects of the invention will become apparent to those skilled in the art upon consideration of the following description of the invention.

The present invention is directed to providing a high speed logic latching device. The device is comprised of first and second inverting circuits. A feedback switching circuit is used for selectively coupling the output of the first inverting circuit to the input of the second inverting circuit and the input of the first inverting circuit to the output of the second inverting circuit. An input switching circuit is used for selectively providing first and second logic signals to the inputs of the first and second inverting circuits, respectively. The input switching circuit and the feedback switching circuit operate in substantially complementary fashion. That is, during a first time interval the feedback switching circuit is open the input switching circuit is closed and during second time interval the input switching circuit is open the feedback switching circuit is closed. During the first time interval the first and second logic signals are provided to the inputs of the first and second inverting circuit. During the second time interval, outputs of the first and second inverting circuits are latched by the feedback switching circuit and the logic signals are no longer provided to the inverting circuits.

The features of the invention believed to be novel are set forth with particularity in the appended claims. The invention itself, however, both as to organization and method of operation together with further objects and advantages thereof, may be best understood by reference to the following description taken in conjunction with the accompanying drawings.

DESCRIPTION OF THE PREFERRED EMBODIMENT

Figure 3:
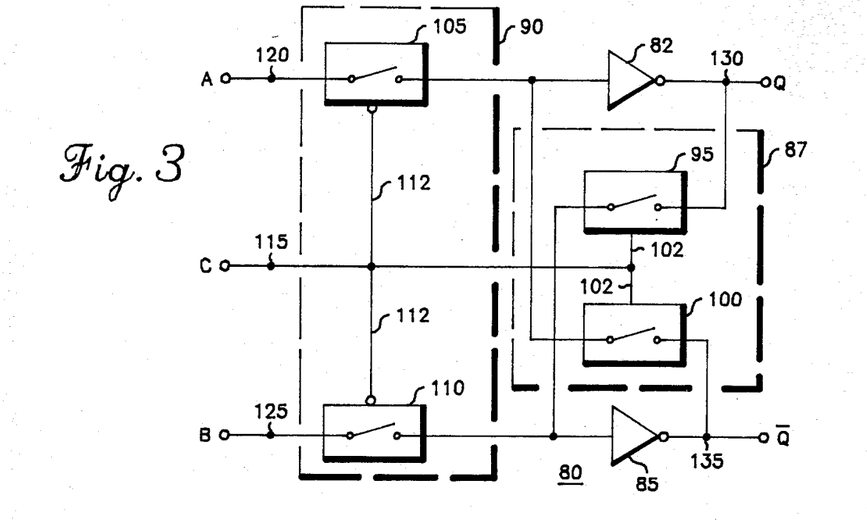
FIG. 3 shows the latch of the present invention.

Referring to FIG. 3 of the drawings latch 80 is composed of four (4) basic portions—a first inverter 82, second inverter 85, feedback switching circuit 87 and input switching circuit 90. The feedback switching circuit 87 is further comprised of a pair of switches 95 and 100 with connected control lines. These switches operate in accordance with the state table of FIG. 4. Switch 95 couples the output of inverter 82 to the input of inverter 85 when switch 95 is closed. Similarly, switch 100 couples the output of inverter 85 to the input of inverter 82 when switch 100 is closed. Switches 95 and 100 by virtue of sharing a common control line 102, will close and open simultaneously.

When feedback switches 87 are closed, inverters 82 and 85 are connected together in series output to input in a continuous loop such that the outputs of both inverters are latched. That is, they are locked in a complementary (opposite logic states) status.

Figures 4, 5, 6:
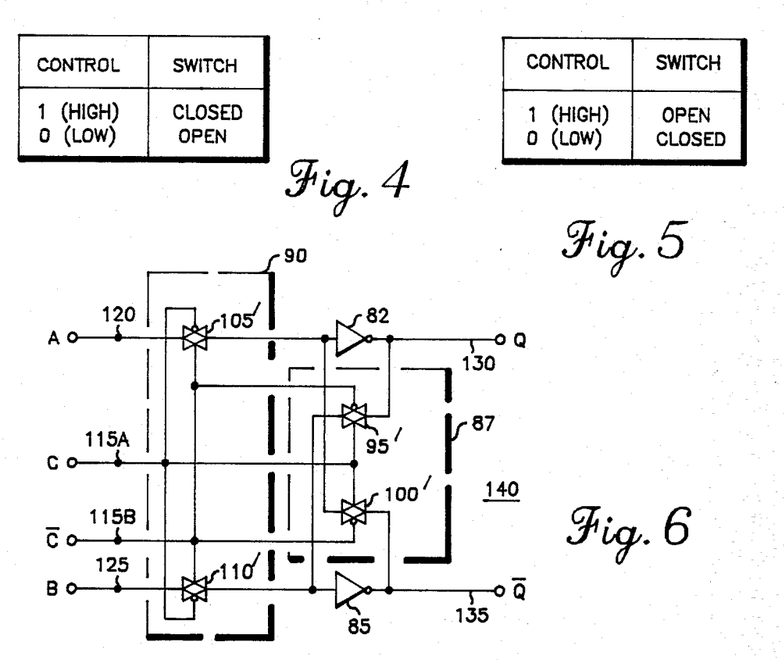
FIG. 4 shows an electrical schematic and a state table of the switch used in FIG. 3.
FIG. 5 shows an electrical schematic and a state table of the switch with inverted control line used in FIG. 3.
FIG. 6 shows a schematic of the preferred embodiment of the latch of FIG. 3.

Input switching circuit 90 is comprised of switches 105 and 110 which share a common control line 112 and operate in accordance with the state table of FIG. 5. Switches 105 and 110 also share a common control terminal 115 with switches 95 and 100. This common control terminal enables switching means 87 and 90 to operate in true complementary fashion. That is, when switches 87 are closed switches 90 will be open and when switches 90 are closed switches 87 will be open.

It should be noted that although the latch of FIG. 3 shows feedback switches 87 as responsive to logic high on terminal 115 and the input switches 90 responsive to logic low on terminal 115, the circuit would be equally operational if the locations of the two types of switches were reversed. In this instance, operation of the latch would be identical to the description below except for the logic state of terminal 115 required to enable and disable the latch.

Operation of the latch of FIG. 3 can now be described when a logic low level is impressed upon terminal 115, switches 90 are closed and switches 87 are open and latch 80 is disabled. This allows transfer of logic signals from terminal 120 to the input of inverter 82. Inverter 82 then logically inverts the input signal A and $\bar{A}$ appears as signal Q at output terminal 130. Similarly, the logic state at terminal 125 is transferred to the input of inverter 85. Inverter 85 logically inverts the logic input signal B and $\bar{B}$ appears as signal $\bar{Q}$ at output terminal 135. With terminal 115 in the logical low state, any set of input signals A and B will be transferred to the logic inverters 82 and 85 for logical inversion at the output terminals 130 and 15 respectively.

When terminal 115 is changed to a logic high switches 90 open while switches 87 close enabling the latch. The opening of switches 90 prohibits inverters 82 and 85 from accepting further input signals impressed upon terminals 120 or 125. If at the time of the switch transition the signals at nodes 130 and 135 are the logical complements of one another the circuit will be latched by the switching action of feedback switches 95 and 100.

If however, the Q and $\bar{Q}$ output signals are not complementary at the time of the switching, an indeterminant state will result. That is, the outputs will not be predictable merely as a result of the inputs. More information, such as layout configuration and transistor size, must be known in order to determine the outputs. This state will generally be avoided for this type of latch.

In the normal operation of this latch, complementary inputs would be impressed upon terminals 120 and 125. When terminal 115 makes a high to low logic level transition the complementary inputs will be transferred to the inverters 82 and 85. Since the switching action of switches 105 and 110 occurs simultaneously, the output terminals 130 and 135 will switch in true complementary fashion. That is, their switching will be substantially simultaneous and certainly less than the typical one gate delay of prior art devices.

FIG. 6 shows latch 140 which is a preferred embodiment implementation of latch 80 of FIG. 3. This implementation utilizes transmission gates for feedback switching circuit 87 and input switching circuit 90. Thus switches 95, 100, 105 and 110 are now replaced by transmission gates 95', 100', 105' and 110' respectively. In order to use standard minimum transistor transmission gates, the control terminal 115 is split into two (2)

control terminals 115A and 115B. The operation of transmission gates of the type utilized is well known in the art. Operation of this latch 140 is completely identical to that of latch 80 except that latch 80 requires only one control signal whereas latch 140 requires two (2) which are the logical complement of each other. The use of two control lines allows for a reduction in the number of actual transistors that are necessary to realize each transmission gate when implemented in an integrated circuit. For larger scales of integration this allows less substrate area to be utilized.

Figures 7, 8:
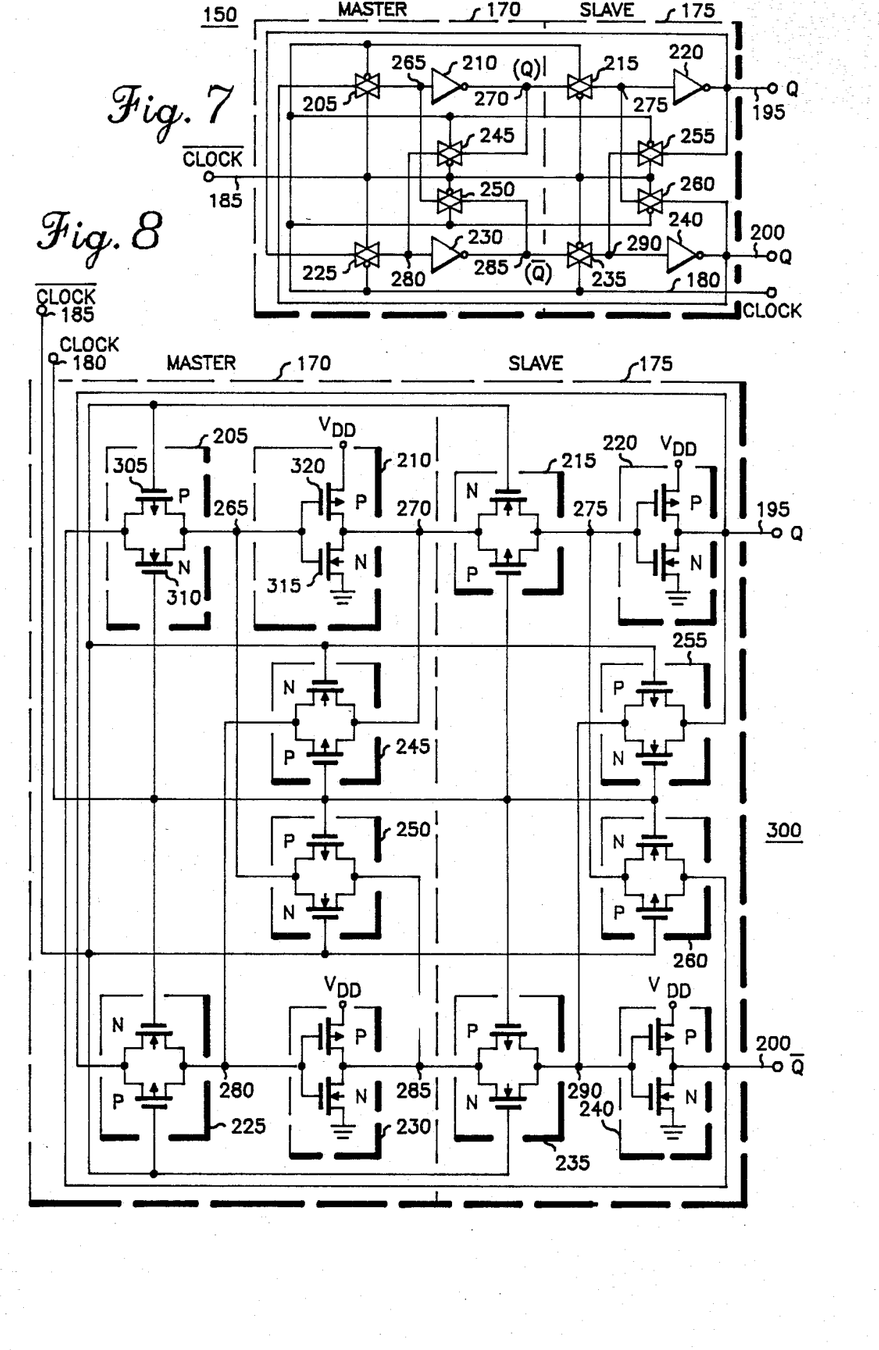
FIG. 7 shows two (2) of the latches of FIG. 6 connected to form a Toggle flip-flop.
FIG. 8 shows the preferred embodiment implementation of the flip-flop of FIG. 7.

Many of the salient features of a latch such as that shown in FIG. 6 are not readily apparent until two or more of the latches are used to form a flip-flop. Once it is thus connected, the flip-flop may be compared with those of the prior art. FIG. 7 illustrates one such flip-flop. The flip-flop is composed of a pair of latches such as those of FIG. 3 or FIG. 6. Flip-flop 150 is a Toggle or T flip-flop. That is, output signals at nodes 195 and 200 toggle at one half the clock frequency input impressed upon terminals 180 and 185. Toggle flip-flops are frequently used in high speed frequency divider circuits such as frequency synthesizers.

In this configuration the Q and $\overline{Q}$ output signals of latch 170 correspond to the A and $\overline{B}$ input signals respectively of latch 175. The Q and $\overline{Q}$ output signals of latch 175 correspond to the B and $\overline{A}$ input signals respectively of latch 170. Clock input terminal 180 and $\overline{\text{clock}}$ input terminal 185 are connected to the control terminals of latches in a manner as shown, cause latches 170 and 175 to latch alternately as terminals 180 and 185 are alternately clocked to logic low and logic high. The flip-flop outputs are taken as the Q and $\overline{Q}$ signals of latch 175 to form the Q output signal at line 195 and the $\overline{Q}$ output signal at line 200.

FIG. 8 shows flip-flop 300 which is a standard CMOS implementation of flip-flop 190 shown in FIG. 7. One can see that only two (2) transistors are required for each transmission gate or inverter gate. For example, transmission gate 205 is composed of a P-channel FET 305 and an N-channel FET 310 with sources and drains connected together. The input signal is applied to the source and the output is taken from the drain or vice-versa as these are typically bi-directional solid state switches. The control lines are applied to the gate of each of the transistors.

Similarly, inverter 210 is made up of N-type transistor 315 and the P-type transistor 320. The gates of transistors 315 and 320 are connected together and the drains of transistors 320 and 315 are connected together, the gate junction forming the input and drain junctions respectively forming the output. It should be noted that although the preferred embodiment implementation is in CMOS one skilled in the art can readily transform this flip-flop or latch design to NMOS or any other technology or mixture of technologies which can produce switches and inverters.

Figure 9:
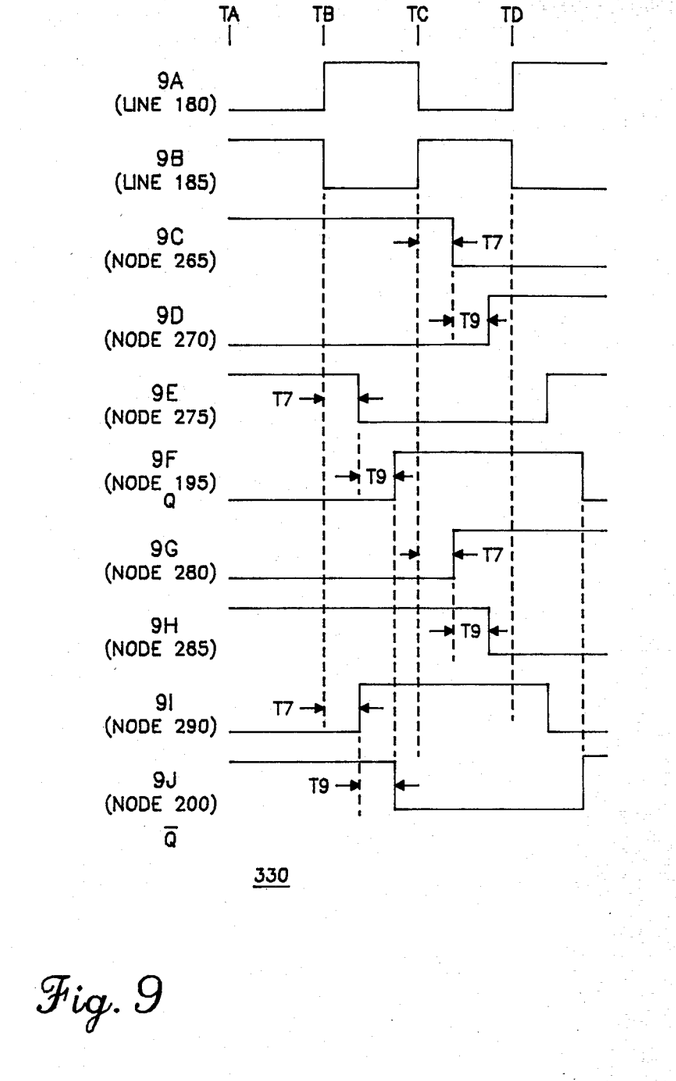
FIG. 9 shows a timing diagram of the Toggle flip-flop of FIGS. 7, and 8.

FIG. 9 shows a timing diagram for the flip-flop of FIGS. 7 and 8. FIGS. 9A and 9B show the clock and $\overline{\text{clock}}$ inputs at lines 180 and 185 respectively. Waveform 9C is present at node 265. Waveform at node 270 is shown in FIG. 9D. The waveform at node 275 is shown in FIG. 9E. The waveform at line 195, the Q output signal, is shown in FIG. 9F. The waveform of FIG. 9G is present at node 280. The waveform at node 285 is shown in FIG. 9H. The waveform at node 290 is shown in FIG. 9I. The waveform of line 200, the $\overline{Q}$ output signal, is shown in FIG. 9J.

The flip-flop state shown in FIG. 9 between times TA and TB represent an initialization of the flip-flop. In this initialized state the clock and $\overline{\text{clock}}$ signals present at nodes 180 and 185 respectively are in low and high states respectively. In this state the Q output signal of FIG. 9F and the $\overline{Q}$ output signal of FIG. 9J are at logic low and high respectively. Also in this time period, the enabled slave latch is driving the disabled master latch. As such, the logic levels at lines 195 and nodes 270, 280 and 290 are all at logical low levels. Lines 200 and nodes 265, 275 and 285 are all at logical high levels.

At time TB the clock and $\overline{\text{clock}}$ inputs change state. This transition latches the previous states of the master by enabling switches 245 and 250 while disabling the path from the slave output to the master input by opening transmission gates 205 and 225. At the same time, the slave latch is disabled by turning off switches 255 and 260. This in turn allows the new state from the master to set the slave through the now enabled switches 215 and 235. The delay T7 shown for the node 275 signal of FIG. 9E is due primarily to the time required for the inverter 210 to discharge the previous logic high on the stray capacitance associated with node 275 through transmission gate 215.

In a similar fashion, the T7 delay for the node 290 signal of FIG. 9I is due primarily to the time required for inverter 230 to change the previous logic low on the stray capacitance associated with node 290. The final change on the outputs at lines 195 and 200 are further delayed by the basic gate delays T9 associated with propagation through the inverters 220 and 240 to produce outputs at lines 195 and 200. As a result, the time required to transfer states from the master to the slave is equal to T7+T9. As a result of the clock transitions there is a logic low at line 200 and nodes 270, 275, and 280, and logic highs are present at line 195 and nodes 285, 290 and 265, at a time just prior to TC.

The next clock transition at time TC acts to enable transmission gates 255 and 260. This acts to latch the states of the Q and $\overline{Q}$ output signals at lines 195 and 200 respectively while the transmission gates 215, 235, 245, and 250 are open disconnecting the path from the master to the slave and disabling the master. At the same time, transmission gates 205 and 225 are enabled to allow the slave to drive the disabled master into a new state.

The delay T7 shown for the node 265 signal in FIG. 9C is the time required for inverter 240 to discharge the previous high on the stray capacitance associated with node 265 through transmission gate 205. In a like manner, the delay T7 in the node 280 signal of FIG. 9G is the time required for inverter 220 to charge the previous low on the stray capacitance associated with node 280 to a high through transmission gate 225. The delays T9 associated with the signals in FIG. 9D and 9H represent the delay associated with propagating the signal through inverters 210 and 230 respectively. As a result, the total time required to transfer the state of the slave to the master is equal to T7+T9 for a total of only two (2) propagation delays which is less than the three (3) propagation delays associated with the prior art.

The fastest a Toggle flip-flop can operate is the time required to transfer the state of the master to the slave plus the time required to transfer the state of the slave to the master. As such, the present flip-flop can toggle at a frequency of $1/(2\ T7+T9)$. This is approximately $\frac{1}{3}$ faster than the flip-flop 20 of the prior art. Also, by observing FIGS. 9F in conjunction with FIG. 9J it is evident that the outputs of the present Toggle flip-flop are truly complementary. True complementary outputs are useful in reducing spikes in logic systems. They also simplify the design of so called "Johnson Counters" and similar devices.

In comparing the present invention with the prior art the differences between design related delays of the signals of FIG. 2F and the signals of FIGS. 9E and 9I lie in the capacitive loads. The capacitance at node 66 of FIG. 1 is equal to that of nodes 275 and 290 of FIG. 7 and as such, delays T1 and T7 are equal. The delays associated with lines 56 and 195, the Q output signals, are related to the load capacitance on the outputs of inverters 34 and 220 respectively. Since the input gate capacitance of an inverter is typically slightly larger than the drain or surce capacitance of two (2) transmission gates, the delay associated with the conventional flip-flop will normally be slightly longer than that associated with that of the flip-flop of the present invention. That is, the gate delay T2 of inverter 34 is normally slightly longer than the gate delay T9 of inverter 220. Also note that an additional gate delay is required to obtain the output at line 58, whereas, the output at line 195 changes simultaneously with the output of line 200.

During the time intervals between TC and TD, in which the slave drives the master, a similar comparison can be made between the delays of FIG. 2 and FIG. 9. As such, the T7 delay of FIG. 9 approximately equal the T1 delay of FIG. 2. Also, the T2 delay of FIG. 2 is normally slightly larger than T9 delays of FIG. 9. It should be noted that due to slight differences in capacitive loading on nodes 62 and 56 as well as 64 and 58 results in the delay of FIG. 2D is slightly longer than the T2 delay of FIG. 2G and the T3 delay of FIG. 2E is slightly shorter than the delay of 2H. These slight differences are neglagable however, since they offset one another and have a negligible effect on the overall comparison of the conventional flip-flop and the flip-flop of the present invention.

Since the T2 delays of FIG. 2 are normally greater than the T9 delays of FIG. 9, the (T1+T2) time delay of FIG. 2 is normally slightly longer than the (T7+T9) time delay of FIG. 9. This slight difference is normally much less than one propagation delay. Therefore, comparing the fastest toggle rate of the conventional flip-flop with the fastest toggle rate of the present flip-flop results in the flip-flop operating greater than 2(T3) seconds faster than the conventional flip-flop. Assuming a 20 ns propagation delay for all propagation delays, the prior art flip-flop can toggle at a frequency of 1/(2[20+20+20]) ns or 8.33 MHz. The flip-flop of the present invention can toggle at a frequency of 1/(2[20+20]) ns or 12.50 MHz.

In CMOS, the speed at which a gate operates may be increased by increasing the dimensions of the transistors which make up the gate. It should be noted however that for the flip-flop of the present design, switches 245, 250, 255 and 260 do not have to be high speed switches in order for the flip-flop to operate at very high speed. This is because these switches are not used to transfer information but are only used to latch the information into the master or slave latch. Since these switches do not have to transfer large amounts of current or operate at very high speeds, they can be manufactured as minimum geometry transmission gates and may take on the minimum geometry allowed by the process used to fabricate the devices.

Since the number of gate delays is reduced for the present invention, the speed requirements of the other transmission gates and inverters are also reduced over that of the prior art flip-flop for designs of equal voltage and speed requirements. It has been determined by computer simulation that the total substrate area required for the flip-flop of the present invention for the same voltage and high frequency requirements can be approximately ⅛ to ¼ the size of the standard flip-flop of FIG. 1. Although, the flip-flop requires a larger number of interconnecting metalization lines, the total area is still reduced. The present invention therefore exhibits a greatly reduced size or speed ratio over the prior art flip-flop.

It should be noted that in the flip-flop configuration of FIG. 7 or similar configurations, the so called "cheater" flip-flop can be implemented by replacing transmission gates 245 and 250 with short circuits. A slightly slower but similar "cheater" design would further replace transmission gate 225 with an open circuit. As is well known in the art, the operation of cheater latches requires that the input drive must be able to overpower the drive of the source of feedback. In this particular case the drive capability of inverters 220 and 240 through transmission gates 225 and 205 must be able to overpower the output of inverters 210 and 230 respectively.

Figure 10:
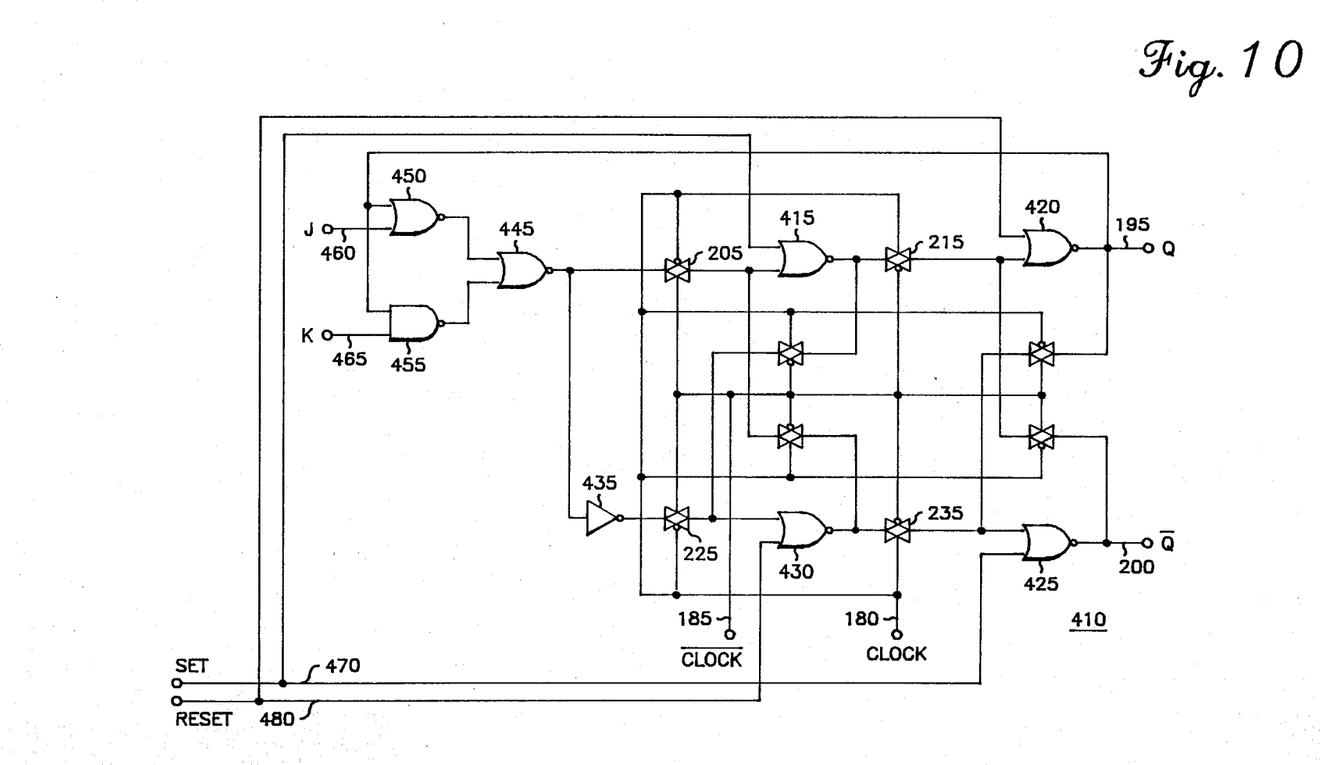
FIG. 10 illustrates how the latches of the present invention can be modified and interconnected to form a J-K flip-flop.

By substituting other types of gates such as NOR, EXCLUSIVE NOR, and NAND gates for the inverter gates, numerous variations of flip-flops may be obtained. An example of such a modifications to the present invention is shown in FIG. 10. A J-K flip-flop 410 is obtained by replacing inverters 210, 220, 230, and 240 of FIG. 7 with NOR gates 415, 420, 425 and 430 and the addition of inverter 435, NOR gates 445 and 450 and NAND gate 455 suitably connected as shown. The connections from lines 195 and 200 to transmission gates 225 and 205 shown in FIG. 7 have been removed. The input of 205 is connected through inverter 435 to the input of 225. Inverter 435 in conjunction with transmission gates 205 and 225 selectively provide complementary logic signals to NOR gates 415 and 430. The output of NOR gate 445 drives the input of 205. NOR gate 445 is driven by NOR gate 450 and NAND gate 455. One input of 450 and 455 is connected to node 195. The second input of 450 is line 460 and is driven by the J signal. The other input of 455 is line 465 and is driven by the K input signal. The second input of 415 and 425 forms line 470 and is driven by the set signal. Similarly, line 480 is driven by the reset signal and drives the second input of 420 and 430 as shown in FIG. 10. Operation of the J-K flip-flop is well known in the art.

Thus it is apparent that there has been provided in accordance with the invention a method that fully satisfies the objects, aims and advantages set forth above. While the invention has been described in conjunction with specific embodiments thereof, it is evident that many alternatives, modifications and variations would be apparent to those skilled in the art in light of the foregoing description. For example, alternate switching means and inverting means may be readily substituted for the transmission gates and inverters as illustrated in FIG. 10 and as discussed regarding "cheater" implementation without departing from the true spirit of the invention. Accordingly, it is intended that the invention embrace all such alternatives, modifications and variations as fall within the spirit and broad scope of the appended claims.

We claim:

1. A logic latching device comprising:
   first and second inverting means;
   feedback switching means for selectively coupling the output of said first inverting means to the input of said second inverting means and the output of said second inverting means to the input of said first inverting means; and
   input switching means for selectively providing first and second logic signals to the inputs of said first and second inverting means respectively, said input switching means and said feedback switching means operating in substantially complementary fashion, in that during a first time interval said input switching means are closed and said feedback switching means are open, and during a second time interval said input switching means are open and said feedback switching means are closed;
   whereby, during the first time interval said first and second logic signals are provided to the inputs of said first and second inverting means, and during the second time interval outputs of said first and second inverting means are latched by said feedback switching means and said logic signals are no longer provided to said first and second inverting means.

2. The device of claim 1 wherein said input switching means substantially simultaneously provides said first and second input logic signals to said first and second inverting means.

3. The device of claim 2 wherein said switching means substantially simultaneously couples the output of said first inverting means to the input of said second inverting means and the output of said second inverting means to the input of said first inverting means.

4. The device of claim 3 wherein said input switching means are comprised of a first pair of transmission gates.

5. The device of claim 4 wherein said feedback switching means are comprised of a second pair of transmission gates.

6. The device of claim 5 wherein said first and second inverting means are selected from the group of logic gates consisting of inverter gates, NAND gates, NOR gates, and EXCLUSIVE-NOR gates.

7. The device of claim 6 wherein said second pair of transmission gates is comprised of substantially minimum geometry transmission gates.

8. The device of claim 7 wherein the outputs of said first and second inverting means assume the complementary state of said first and second logic signals respectively in less than three propagation delays after said input switching means are enabled.

9. The device of claim 8 wherein said logic latching device is implemented in CMOS.

10. The device of claim 8 wherein said logic latching device is implemented in NMOS.

11. The device of claim 1 wherein the outputs of said first and second inverting means assume the complementary state of said first and second logic signals respectively in less than three propagation delays after said input switching means are enabled.

12. A logic latching device comprising:
    first and second inverting means;
    a first transmission gate having substantially minimum geometry connected serially between the output of said first inverting means and the input of said second inverting means;
    a second transmission gate having substantially minimum geometry connected serially between the output of said second inverting means and the input of said first inverting means, said first and second transmission gates operationally connected to open and close substantially simultaneously;
    a third transmission gate for providing a first logic signal to the input of said first inverting means and operationally connected to open and close in substantially complementary fashion with said first and second transmission gates; and
    a fourth transmission gate for providing a second logic signal to the input of said second inverting means, said third and fourth transmission gates operationally connected to open and close substantially simultaneously.

13. The device of claim 12 wherein said logic latching device is implemented in CMOS.

14. The device of claim 12 wherein said logic latching device is implemented in NMOS.

15. A Toggle flip-flop comprising:
    a first latch having first and second inverting means and feedback switching means for selectively coupling the output of said first inverting means to the input of said second inverting means and the output of said second inverting means to the input of said first inverting means, also having input switching means for selectively providing first and second logic signals to the inputs of said first and second inverting means respectively, said input switching means and said feedback switching means operating in substantially complementary fashion;
    a second latch having third and fourth inverting means and feedback switching means for selectively coupling the output of said third inverting means to the input of said fourth inverting means and the output of said fourth inverting means to the input of said third inverting means, also having input switching means for selectively coupling the output of said first and second inverting means to the input of said third and fourth inverting means respectively, the outputs of said third and fourth inverting means providing said second and first logic signals respectively, said input switching means and said feedback switching means operating in substantially complementary fashion; and
    control means for enabling and disabling said first and second latches in substantially complementary fashion.

16. The device of claim 15 wherein said Toggle flip-flop is implemented in CMOS.

17. The device of claim 15 wherein said Toggle flip-flop is implemented in NMOS.

18. A flip-flop comprising:
    a first latch having first and second inverting means with feedback switching means for selectively coupling the output of said first inverting means to the input of said second inverting means and the output of said second inverting means to a second input of said first inverting means, said first latch having input means for selectively providing logic signals to the inputs of said first and second inverting means;
    a second latch having third and fourth inverting means and having feedback switching means for selectively coupling the output of said third inverting means to the input of said fourth inverting means and the output of said fourth inverting means to the input of said third inverting means, said second latch also having an input switching means for selectively coupling the outputs of said first and second inverting means to the inputs of said third and fourth inverting means respectively; and clock means for alternately enabling and disabling said first and second latches in complementary fashion.

19. The flip-flop of claim 18 wherein said input means provides complementary inputs to said first and second inverting means.

20. The flip-flop of claim 19 wherein at least one of said inverting means is a selectively enabled inverting means.

21. The flip-flop of claim 20 wherein said first and fourth inverting means are selectively enabled by a first input signal.

22. The flip-flop of claim 21 wherein said second and third inverting means are selectively enabled by a second input signal.

23. The flip-flop of claim 22 further including input decision means responsive to an output of at least one of said third and fourth inverting means and a third input signal for selectively providing a logic signal to said input means.

24. The device of claim 23 wherein said flip-flop is implemented in CMOS.

25. The device of claim 24 wherein said flip-flop is implemented in NMOS.

* * * * *